United States Patent
Morskieft et al.

(10) Patent No.: US 11,927,618 B2
(45) Date of Patent: Mar. 12, 2024

(54) LIFETIME PREDICTION OF A GAS FILLING OF AN ELECTRICAL SWITCHGEAR

(71) Applicant: Eaton Intelligent Power Limited, Dublin (IE)

(72) Inventors: Elise Morskieft, Overijssel (NL); Marcel Van Dijk, Overijssel (NL); Vijay Kumar, West Bengal (IN); Yogesh Rajwade, Maharashtra (IN)

(73) Assignee: EATON INTELLIGENT POWER LIMITED, Dublin (IE)

( * ) Notice: Subject to any disclaimer, the term of this patent is extended or adjusted under 35 U.S.C. 154(b) by 0 days.

(21) Appl. No.: 17/929,091

(22) Filed: Sep. 1, 2022

(65) Prior Publication Data
US 2023/0076611 A1    Mar. 9, 2023

(30) Foreign Application Priority Data

Sep. 7, 2021  (IN) .............................. 202111040504
Oct. 27, 2021 (GB) ..................................... 2115415

(51) Int. Cl.
*G01R 31/08*    (2020.01)
*G01R 31/12*    (2020.01)

(52) U.S. Cl.
CPC ................. *G01R 31/1254* (2013.01)

(58) Field of Classification Search
CPC .. G01R 31/1254; G01R 31/44; G01R 31/327; G01R 31/3271; G01R 31/3272; G01R 31/3274; G01R 31/3275; G01R 31/333
See application file for complete search history.

(56) References Cited

U.S. PATENT DOCUMENTS

| | | | |
|---|---|---|---|
| 2007/0027640 A1 | 2/2007 | Rhodes et al. | |
| 2008/0157783 A1* | 7/2008 | Savary | G01R 31/64 324/548 |
| 2009/0248606 A1 | 10/2009 | Heinemann et al. | |
| 2011/0309939 A1* | 12/2011 | Glock | H02B 13/065 340/657 |
| 2013/0215555 A1* | 8/2013 | Kieffel | H02B 13/055 29/622 |

(Continued)

FOREIGN PATENT DOCUMENTS

| | | |
|---|---|---|
| EP | 3621096 A1 | 3/2020 |
| JP | H05115111 A | 5/1993 |

(Continued)

*Primary Examiner* — Thang X Le
(74) *Attorney, Agent, or Firm* — LEYDIG, VOIT & MAYER, LTD.

(57) ABSTRACT

A method of predicting a lifetime of a gas filling of an electrical switchgear is disclosed, wherein pressure values $p_1$, $p_2$ in a system of the electrical switchgear containing the gas filling at a predefined temperature $T_p$ at different points in time $t_1$, $t_2$ are measured. Based on the pressure difference $\Delta p$ between the pressure values $p_1$, $p_2$ the lifetime of the gas filling is calculated. Alternatively, the pressure values $p_1$, $p_2$ can be taken at temperatures $T_1$, $T_2$ within a predefined temperature range at different points in time $t_1$, $t_2$.

8 Claims, 2 Drawing Sheets

(56) References Cited

U.S. PATENT DOCUMENTS

| | | | |
|---|---|---|---|
| 2015/0276531 A1 | 10/2015 | Matsuhiro et al. | |
| 2015/0308938 A1* | 10/2015 | Scheucher | G01N 33/0006 73/1.06 |
| 2015/0355049 A1* | 12/2015 | Ait Abdelmalek | G01M 3/002 702/45 |
| 2016/0356852 A1* | 12/2016 | Lee | G01R 31/327 |

FOREIGN PATENT DOCUMENTS

| | | |
|---|---|---|
| JP | H50115111 A | 5/1993 |
| JP | 2012209042 A | 10/2012 |
| JP | 2015187561 A1 | 10/2015 |
| JP | 2020072614 A | 5/2020 |
| WO | WO 2021010037 A1 | 1/2021 |

\* cited by examiner

LIFETIME PREDICTION OF A GAS FILLING OF AN ELECTRICAL SWITCHGEAR

CROSS-REFERENCE TO RELATED APPLICATIONS

This application claims priority pursuant to 35 U.S.C. 119(a) to Indian Application No. 202111040504, filed Sep. 7, 2021, and United Kingdom Application No. 2115415.8, filed Oct. 27, 2021, which applications are incorporated herein by reference in their entireties.

TECHNICAL FIELD

The invention relates to a method of predicting a lifetime of a gas filling of an electrical switchgear.

BACKGROUND ART

Initially, the system of an electrical switchgear can be filled with an insulating gas forming the gas filling of the electrical switchgear. For example, the insulating gas may consist of or comprise Sulfur hexafluoride (SF6). Over time, the gas filling may leak from the system so that the insulating function may decrease. To ensure a minimum of the insulating function, e.g. for switching devices arranged within the gas filled system, a minimum pressure value of the gas filling can be defined. Once the pressure of the gas filling drops below this minimum pressure value, operation of the electrical switchgear can get dangerous. That is why it is advisable to stop the operation of the electrical switchgear in such a situation. Unfortunately, such a situation may occur unexpectedly and lead to an unwanted downtime of the electrical switchgear.

DISCLOSURE OF INVENTION

Accordingly, an object of the invention is the provision of a method of predicting a lifetime of a gas filling of an electrical switchgear. In particular, an unexpected downtime of an electrical switchgear shall be avoided.

The object of the invention is solved by a method of predicting a lifetime of a gas filling of an electrical switchgear, which comprises the steps of a) measuring a first pressure value $p_1$ in a system of the electrical switchgear containing the gas filling at a predefined temperature $T_p$ at a first point in time $t_1$ and measuring a second pressure value $p_2$ in the system of the electrical switchgear containing the gas filling at the same predefined temperature $T_p$ at a second point in time $t_2$ or b) measuring a first pressure value $p_1$ in a system of the electrical switchgear containing the gas filling at a first temperature $T_1$ within a predefined temperature range at a first point in time $t_1$ and measuring a second pressure value $p_2$ in the system of the electrical switchgear containing the gas filling at a second temperature $T_2$ within the same predefined temperature range at a second point in time $t_2$, calculating a pressure difference $\Delta p$ between the first pressure value $p_1$ and the second pressure value $p_2$ and calculating a lifetime of the gas filling based on said pressure difference $\Delta p$.

In this way, unexpected downtimes of the electrical switchgear can be avoided, and maintenance of the electrical switchgear can be planned better.

To avoid that fast temperature changes of the gas filling, which may be caused by a switching operation of a switching device arranged within the gas filled system, it is proposed to take pressure values at the same predefined temperature $T_p$ or at least at temperatures within a predetermined temperature range. In particular, switching arcs during opening of the switching contacts of such a switching device can heat up the gas filling quickly and cause spikes in graphs of the pressure p and the temperature T of the gas filling. Tests and investigations revealed that there is a time difference between the spikes of the pressure p and the temperature T. Hence, using the gas equation:

$$p \cdot V_{gas} = R \cdot T$$

wherein R is the gas constant of the gas filling and V g as is the volume of the gas filling, to take the influence of the temperature T on the pressure p into consideration, may lead to invalid lifetime predictions under unfavorable circumstances, in detail when measuring the pressure p and the temperature T is done during such transition phases like switch off of the switching device. However, that does not necessarily mean that pressure values are only taken at a predefined temperature $T_p$ or in a temperature range, but pressure p can be measured continuously, and suitable values can be picked out of the data stream for the lifetime prediction calculation.

In particular the total lifetime $LT_{total}$ of the gas filling can be calculated by use of the formulas:

$$\Delta p_{ptu} = \frac{p_{high} - p_{low}}{LT_{nominal}}$$

$$LT_{nominal} = \frac{p_{high} - p_{low}}{\Delta p_{ptu}}$$

$$LT_{total} = \Delta t \cdot \frac{\Delta p_{ptu}}{\Delta p} \cdot LT_{nominal} = (t_2 - t_1) \cdot \frac{\Delta p_{ptu}}{p_2 - p_1} \cdot LT_{nominal}$$

wherein $p_1$ is the first pressure value, $p_2$ is the second pressure value, $\Delta p$ is the pressure difference between the second pressure value $p_2$ and the first pressure value $p_1$, $t_1$ is the first point in time and $t_2$ is the second point in time, $\Delta t$ is the time difference between the second point in time $t_2$ and the first point in time $t_1$, $\Delta p_{ptu}$ is the nominal pressure drop per time unit (for example per year), $LT_{nominal}$ is the nominal lifetime of the gas filling, $p_{low}$ is the minimum pressure value of the gas filling and $p_{high}$ is the maximum pressure value of the gas filling.

The minimum pressure value $p_{low}$ of the gas filling ensures a minimum level of insulation. Below that value, operation of the electrical switchgear may get dangerous. The maximum pressure value $p_{high}$ of the gas filling normally is the initial pressure when the system is filled. The nominal lifetime $LT_{nominal}$ of the gas filling is the expected lifetime of the gas filling, e.g. 30 years. The nominal pressure drop per time unit $\Delta p_{ptu}$ corresponds to this nominal lifetime $LT_{nominal}$ and the difference between the maximum pressure value $p_{high}$ and the minimum pressure value $p_{low}$.

A remaining lifetime $LT_{remain}$ of the gas filling can be calculated by use of the formula:

$$LT_{remain} = LT_{total} \cdot \frac{p_2 - p_{low}}{p_{high} - p_{low}}$$

In another embodiment, the total lifetime $LT_{total}$ of the gas filling can be calculated by use of the formula:

$$LT_{total} = \Delta t \cdot \frac{p_{high} - p_{low}}{\Delta p} = (t_2 - t_1) \cdot \frac{p_{high} - p_{low}}{p_2 - p_1}$$

wherein $p_1$ is the first pressure value, $p_2$ is the second pressure value, $p_{low}$ is the minimum pressure value of the gas filling, $p_{high}$ is the maximum pressure value of the gas filling, $\Delta p$ is the pressure difference between the second pressure value $p_2$ and the first pressure value $p_1$, $t_1$ is the first point in time, $t_2$ is the second point in time and $\Delta t$ is the time difference between the second point in time $t_2$ and the first point in time $t_1$.

Further on, the remaining lifetime $LT_{remain}$ of the gas filling can be calculated by use of the formula:

$$LT_{remain} = \Delta t \cdot \frac{p_2 - p_{low}}{\Delta p} = (t_2 - t_1) \cdot \frac{p_2 - p_{low}}{p_2 - p_1}$$

wherein $p_1$ is the first pressure value, $p_2$ is the second pressure value, $p_{low}$ is the minimum pressure value of the gas filling, $\Delta p$ is the pressure difference between the second pressure value $p_2$ and the first pressure value $p_1$, $t_1$ is the first point in time and $t_2$ is the second point in time and $\Delta t$ is the time difference between the second point in time $t_2$ and the first point in time $t_1$.

In an advantageous embodiment, the first pressure value $p_1$ can be replaced by $p_{1corr}$ and referenced to a reference temperature $T_{ref}$ and/or the second pressure value $p_2$ can be replaced by $p_{2corr}$ and referenced to a reference temperature $T_{ref}$ in the aforementioned formulas by use of the following formulas:

$$p_{1corr} = p_1 - R \cdot \frac{T_1 - T_{ref}}{V_{gas}}$$

$$p_{2corr} = p_2 - R \cdot \frac{T_2 - T_{ref}}{V_{gas}}$$

wherein $T_1$ is the first temperature, $T_2$ is the second temperature, $V_{gas}$ is the volume of the gas filling, R is the gas constant of the gas filling, $p_{1corr}$ is the first corrected pressure value and $p_{2corr}$ is the second corrected pressure value. By these measures, the pressures $p_1$ and $p_2$ may be determined more accurately when a temperature range is defined for taking pressure measurements. Preferably, the reference temperature $T_{ref}$ is within said temperature range.

Preferably, the first pressure value $p_1$ and/or the second pressure value $p_2$ is calculated based on a volume change of a capacitor having an elastomer as a dielectric material between two electrodes of the capacitor.

In detail, a deformation of the elastomer or dielectric material based on a pressure change $\Delta p$ may cause a proportional volume change $\Delta V$ in view of an initial volume $V_0$ at an initial pressure. The proportionality factor usually is denoted B, and the formula for the pressure change $\Delta p$ reads as:

$$\Delta p = B \frac{\Delta V}{V_0}$$

A volume change may be calculated based on a change of the capacitance of the capacitive pressure sensor. Provided that the capacitor is ball shaped, the capacitance C can be calculated by use of the formula:

$$C = \frac{4\pi\varepsilon_0\varepsilon_r}{\frac{1}{r_i} - \frac{1}{r_o}}$$

Wherein $r_o$ is the radius of the outer flexible electrode, $r_i$ is the radius of the inner (rigid) electrode, $\varepsilon_0$ is the absolute permittivity or absolute dielectric constant and $\varepsilon_r$ is the relative permittivity or relative dielectric constant. Based on the known radius $r_i$ of the inner (rigid) electrode and the radius $r_o$ of the outer flexible electrode at an initial pressure and an actual pressure, the volume change $\Delta V$ and thus the pressure change $\Delta p$ can easily be calculated. Of course, other shapes of capacitive pressure sensors work as well, for example cylindrical shapes.

Preferably, an alarm is output if the first pressure value $p_1$ or the second pressure value $p_2$ drops below a minimum pressure value $p_{low}$ of the gas filling. For example, this alarm can be output via a signal lamp and/or a wireless interface so as to inform responsible personnel. In this way, exceptional pressure drops can be recognized.

Advantageously, the predefined temperature $T_p$ or the predefined temperature range is chosen according to the IEC standard IEC 62271-100/200 or a nominal temperature operating range of the electrical switchgear. In this way, suitable predefined temperatures $T_p$ or temperature ranges may be chosen.

BRIEF DESCRIPTION OF DRAWINGS

The invention now is described in more detail hereinafter with reference to particular embodiments, which the invention however is not limited to.

DETAILED DESCRIPTION

Generally, same parts or similar parts are denoted with the same/similar names and reference signs. The features disclosed in the description apply to parts with the same/similar names respectively reference signs. Indicating the orientation and relative position is related to the associated figure, and indication of the orientation and/or relative position has to be amended in different figures accordingly as the case may be.

Figure 1:
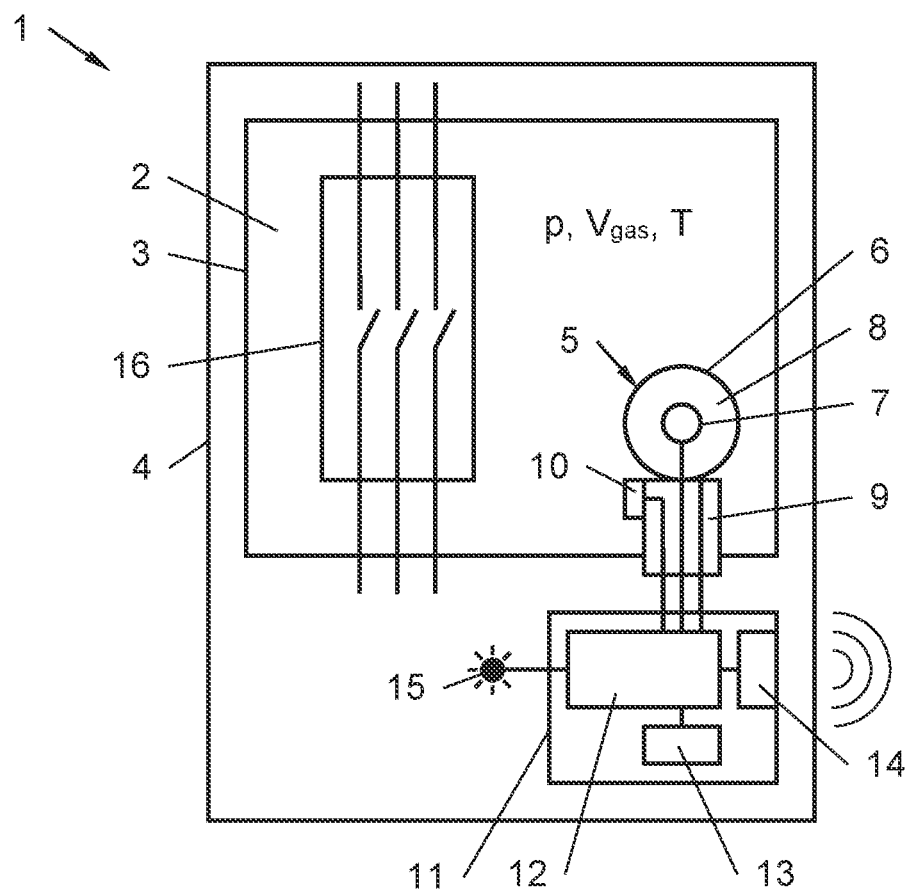
FIG. 1 shows a schematic view of an electrical switchgear.

FIG. 1 shows a schematic view of an electrical switchgear 1, which comprises a gas filling 2 in a gas tank 3 within a housing 4 of the electrical switchgear 1. The gas filling 2 has the pressure p, the volume V gas and the temperature T.

In the gas tank 3, the electrical switchgear 1 comprises a capacitive pressure sensor 5 with an outer electrode 6, an inner electrode 7 and a dielectric material 8 in-between as well as a base 9. The dielectric material 8 may consist of or comprise an elastomer. The pressure p of the gas filling 2 can be calculated based on a volume change of the capacitor formed by the electrodes 5 and 6 and the dielectric material 8.

Moreover, a temperature sensor 10 is arranged on the base 9. The capacitive pressure sensor 5 and the temperature sensor 10 are connected to an evaluation unit 11a, which comprises a processor 12, a memory 13 and a wireless interface 14. Moreover, a signal lamp 15 is connected to the evaluation unit 11a. Finally, the electrical switchgear 1 comprises an exemplary switching device 16 arranged in the gas filling 2.

It should be noted that the gas tank 3 may be part of a larger system filled with the gas filling 2. For example, the system may comprise additional chambers, tubes and so on. Accordingly, the pressure sensor 5 and/or the temperature sensor 10 are not necessarily arranged in the gas tank 3 but may be arranged at another position within the system filled with the insulating gas.

The function of the electrical switchgear 1 is now as follows:

Initially, the system and thus the gas tank 3 are filled with an insulating gas forming the gas filling 2 of the electrical switchgear 1. For example, the insulating gas may consist of or comprise Sulfur hexafluoride (SF6). Over time, the gas filling 2 may leak from the system, in particular from the gas tank 3, so that the insulating function may decrease. To ensure a minimum of the insulating function, e.g. for the switching device 16 and other devices as the case may be, a minimum pressure value $p_{low}$ of the gas filling 2 can be defined. Once the pressure p of the gas filling 2 drops below this minimum pressure value $p_{low}$, operation of the electrical switchgear 1 can get dangerous. That is why it is advisable to stop the operation of the electrical switchgear 1 in such a situation.

To avoid unexpected downtimes of the electrical switchgear 1, the lifetime of the gas filling 2 is predicted according to the following method, which comprises the steps of:

a) measuring a first pressure value $p_1$ in the system of the electrical switchgear 1 containing the gas filling 2 at a predefined temperature $T_p$ at a first point in time $t_1$ and measuring a second pressure value $p_2$ in the system of the electrical switchgear 1 containing the gas filling 2 at the same predefined temperature $T_p$ at a second point in time $t_2$ or b) measuring a first pressure value $p_1$ in the system of the electrical switchgear 1 containing the gas filling 2 at a first temperature $T_1$ within a predefined temperature range at a first point in time $t_1$ and measuring a second pressure value $p_2$ in the system of the electrical switchgear 1 containing the gas filling 2 at a second temperature $T_2$ within the same predefined temperature range at a second point in time $t_2$, calculating a pressure difference $\Delta p$ between the first pressure value $p_1$ and the second pressure value $p_2$ and calculating the lifetime of the gas filling 2 based on said pressure difference $\Delta p$.

In particular, the total lifetime $LT_{total}$ of the gas filling can be calculated by use of the formulas:

$$\Delta p_{ptu} = \frac{p_{high} - p_{low}}{LT_{nominal}}$$

$$LT_{nominal} = \frac{p_{high} - p_{low}}{\Delta p_{ptu}}$$

$$LT_{total} = \Delta t \cdot \frac{\Delta p_{ptu}}{\Delta p} \cdot LT_{nominal} = (t_2 - t_1) \cdot \frac{\Delta p_{ptu}}{p_2 - p_1} \cdot LT_{nominal}$$

wherein $p_1$ is the first pressure value, $p_2$ is the second pressure value, $\Delta p$ is the pressure difference between the second pressure value $p_2$ and the first pressure value $p_1$, $t_1$ is the first point in time and $t_2$ is the second point in time, $\Delta t$ is the time difference between the second point in time $t_2$ and the first point in time $t_1$, $\Delta p_{ptu}$ is the nominal pressure drop per time unit (for example per year), $LT_{nominal}$ is the nominal lifetime of the gas filling 2, $p_{low}$ is the minimum pressure value of the gas filling 2 and $p_{high}$ is the maximum pressure value of the gas filling 2.

As already mentioned, $p_{low}$ is the minimum pressure value of the gas filling 2 above which safe operation of the electrical switchgear 1 is ensured. The maximum pressure value $p_{high}$ of the gas filling 2 normally is the initial pressure when the system or gas tank 3 is filled. The nominal lifetime $LT_{nominal}$ of the gas filling 2 is the expected lifetime of the gas filling 2, e.g. 30 years. The nominal pressure drop per time unit $\Delta p_{ptu}$ corresponds to the nominal lifetime $LT_{nominal}$ of the gas filling 2 and the difference between the maximum pressure value $p_{high}$ and the minimum pressure value $p_{low}$ of the gas filling 2.

A remaining lifetime $LT_{remain}$ of the gas filling 2 can be calculated by use of the formula:

$$LT_{remain} = LT_{total} \cdot \frac{p_2 - p_{low}}{p_{high} - p_{low}}$$

In detail, the pressure p of the gas filling 2 is measured by means of the pressure sensor 5, in this embodiment by measuring the capacitance formed by the electrodes 6 and 7. To avoid that fast temperature changes of the gas filling 2, which may be caused by a switching operation of the switching device 16, it is proposed to take pressure values at the same predefined temperature $T_p$ or at least at temperatures T within a predetermined temperature range. In particular switching arcs during opening of the switching contacts of the switching device 16 can heat up the gas filling 2 quickly and cause spikes in graphs of the pressure p and the temperature T of the gas filling 2. Tests and investigations revealed that there is a time difference between the spikes of the pressure p and the temperature T. Using the gas equation:

$$p \cdot V_{gas} = R \cdot T$$

wherein R is the gas constant of the gas filling to consider the influence of the temperature T on the pressure p, may lead to invalid lifetime predictions under unfavorable circumstances, in detail when measuring the pressure p and the temperature T is done during such transition phases like switch off of the switching device 16. However, that does not necessarily mean that pressure values are only taken at a predetermined temperature $T_p$ or within a temperature range, but pressure p can be measured continuously, and suitable values can be picked out of the data stream for the lifetime prediction calculation.

So, in detail the processor 12 of the evaluation unit 11a may continuously (i.e. in predetermined time intervals) take measurements of the pressure p by use of the pressure sensor 5 and measurements of the temperature T by use of the temperature sensor 10 and store the same in the memory 13. For calculation of the lifetime of the gas filling 2, measured values may be read from the memory 13 and used for the above calculations. Alternatively, the processor 12 may monitor the temperature T by use of the temperature sensor 10 and measure the pressure p at suitable temperatures.

The predefined temperature $T_p$ or the predefined temperature range may be chosen according to the IEC standard IEC 62271-100/200 or a nominal temperature operating range of the electrical switchgear 1. In this way, suitable predefined temperatures $T_p$ or temperature ranges may be chosen.

In a preferred embodiment, an alarm can be output if the first pressure value $p_1$ or the second pressure value $p_2$ drops below the minimum pressure value $p_{low}$ of the gas filling 2.

For example, this alarm can be output via the signal lamp 15 and/or the wireless interface 14 so as to inform responsible personnel. In this way, exceptional pressure drops can be recognized.

In another embodiment, the total lifetime $LT_{total}$ of the gas filling 2 can be calculated by use of the formula:

$$LT_{total} = \Delta t \cdot \frac{p_{high} - p_{low}}{\Delta p} = (t_2 - t_1) \cdot \frac{p_{high} - p_{low}}{p_2 - p_1}$$

and the remaining lifetime $LT_{remain}$ of the gas filling 2 can be calculated by use of the formula:

$$LT_{remain} = \Delta t \cdot \frac{p_2 - p_{low}}{\Delta p} = (t_2 - t_1) \cdot \frac{p_2 - p_{low}}{p_2 - p_1}$$

In all embodiments, beneficially the first pressure value $p_1$ can be replaced by $p_{1corr}$ and referenced to a reference temperature $T_{ref}$ and/or the second pressure value $p_2$ can be replaced by $p_{2corr}$ and referenced to a reference temperature $T_{ref}$ in the aforementioned formulas by use of the formulas:

$$p_{1corr} = p_1 - R \cdot \frac{T_1 - T_{ref}}{V_{gas}}$$

$$p_{2corr} = p_2 - R \cdot \frac{T_2 - T_{ref}}{V_{gas}}$$

wherein $p_{1corr}$ is the first corrected pressure value and $p_{2corr}$ is the second corrected pressure value. By these measures, the pressure p may be determined more accurately when a temperature range is defined for taking pressure measurements. Preferably, the reference temperature $T_{ref}$ is within said temperature range.

Generally, the pressure p of the gas filling 2 can be calculated based on a volume change of the capacitor formed by the electrodes 6 and 7 and the dielectric material 8 as mentioned hereinbefore. In detail, a deformation of the elastomer or dielectric material 8 based on a pressure change $\Delta p$ causes a proportional volume change $\Delta V$ in view of an initial volume $V_0$ at an initial pressure. The proportionality factor usually is denoted B, and the formula for the pressure change $\Delta p$ reads as:

$$\Delta p = B \frac{\Delta V}{V_0}$$

A volume change $\Delta V$ may easily be calculated based on a change of the capacitance of the capacitive pressure sensor 5. Provided that the capacitor is ball shaped, the capacitance C can be calculated by use of the formula:

$$C = \frac{4\pi \varepsilon_0 \varepsilon_r}{\frac{1}{r_i} - \frac{1}{r_o}}$$

wherein $r_o$ is the radius of the outer flexible electrode 6, $r_i$ is the radius of the inner (rigid) electrode 7, $\varepsilon_0$ is the absolute permittivity or absolute dielectric constant and $\varepsilon_r$ is the relative permittivity or relative dielectric constant. Based on the known the radius $r_i$ of the inner (rigid) electrode 7, the radius $r_o$ of the outer flexible electrode 6 at an initial pressure and an actual pressure, the volume change $\Delta V$ and thus the pressure change $\Delta p$ can easily be calculated.

Figure 2:
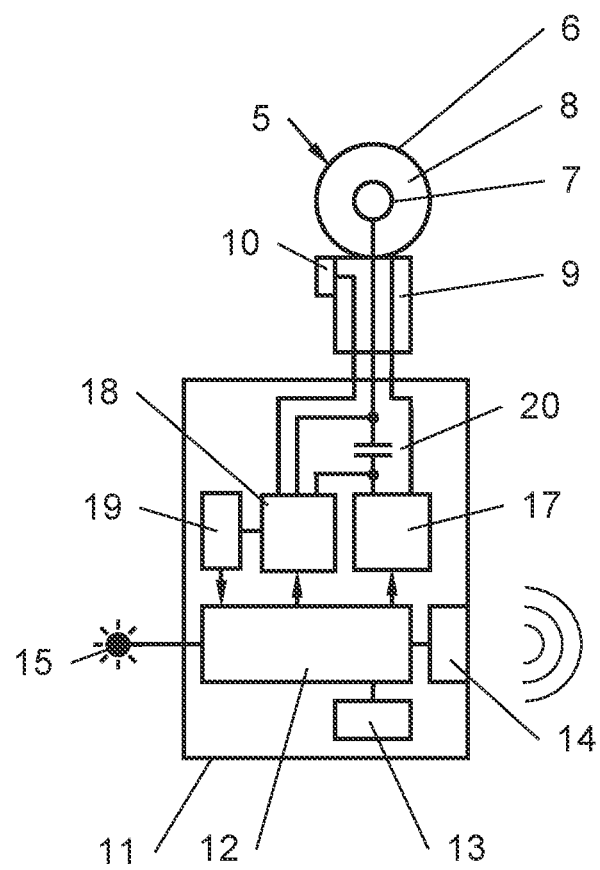
FIG. 2 shows a more detailed embodiment of an evaluation unit.

FIG. 2 finally shows a more detailed embodiment of an evaluation unit 11b, which in addition to the parts of the evaluation unit 11a of FIG. 1 comprises a signal injector 17, a signal conditioner 18, a signal amplifier 19 and a capacitor 20. The signal injector 17 is provided to apply a signal to the serial connection of the capacitor 20 and the capacitive pressure sensor 5. The signal conditioner 18 is provided to generate a pressure signal based on the voltage across the capacitor 20 and based on the signal of the temperature sensor 10. The signal amplifier 19 finally amplifies the signal from the signal conditioner 18 and outputs its signal to the processor 12.

It is noted that the invention is not limited to the embodiments disclosed hereinbefore, but combinations of the different variants are possible. In reality, the electrical switchgear 1 and the evaluation unit 11a, 11b may have more or less parts than shown in the figures. Moreover, the description may comprise subject matter of further independent inventions.

It should also be noted that the term "comprising" does not exclude other elements and the use of articles "a" or "an" does not exclude a plurality. Also elements described in association with different embodiments may be combined. It should also be noted that reference signs in the claims should not be construed as limiting the scope of the claims.

LIST OF REFERENCE NUMERALS 1 electrical switchgear
2 gas filling
3 gas tank
4 housing
5 pressure sensor
6 outer electrode
7 inner electrode
8 dielectric material
9 base
10 temperature sensor
11a, 11b evaluation unit
12 processor
13 memory
14 wireless interface
15 signal lamp
16 switching device
17 signal injector
18 signal conditioner
19 signal amplifier
20 capacitor
p pressure
T temperature
$V_{gas}$ volume of gas filling

The invention claimed is:

1. A method of predicting a lifetime of a gas filling of an electrical switchgear, comprising the steps of:
  a) measuring a first pressure value $p_1$ in a system of the electrical switchgear containing the gas filling at a predefined temperature $T_p$ at a first point in time $t_1$ and measuring a second pressure value $p_2$ in the system of the electrical switchgear containing the gas filling at the same predefined temperature $T_p$ at a second point in time $t_2$; or,
  b) measuring a first pressure value $p_1$ in a system of the electrical switchgear containing the gas filling at a first temperature $T_1$ within a predefined temperature range at a first point in time $t_1$ and measuring a second pressure value $p_2$ in the system of the electrical switchgear containing the gas filling at a second temperature $T_2$ within the same predefined temperature range at a second point in time $t_2$;

calculating a pressure difference $\Delta p$ between the first pressure value $p_1$ and the second pressure value $p_2$; and, calculating a lifetime of the gas filling based on said pressure difference $\Delta p$, wherein the first pressure value $p_1$ and/or the second pressure value $p_2$ is calculated based on a volume change of a capacitor having an elastomer as a dielectric material between two electrodes of the capacitor.

2. The method as claimed in claim 1, wherein the total lifetime $LT_{total}$ of the gas filling is calculated by use of the formulas:

$$\Delta p_{ptu} = \frac{p_{high} - p_{low}}{LT_{nominal}}$$

$$LT_{nominal} = \frac{p_{high} - p_{low}}{\Delta p_{ptu}}$$

$$LT_{total} = \Delta t \cdot \frac{\Delta p_{ptu}}{\Delta p} \cdot LT_{nominal} = (t_2 - t_1) \cdot \frac{\Delta p_{ptu}}{p_2 - p_1} \cdot LT_{nominal}$$

wherein $p_1$ is the first pressure value, $p_2$ is the second pressure value, $\Delta p$ is the pressure difference between the second pressure value $p_2$ and the first pressure value $p_1$, $t_1$ is the first point in time and $t_2$ is the second point in time, $\Delta t$ is the time difference between the second point in time $t_2$ and the first point in time $t_1$, $\Delta p_{ptu}$ is the nominal pressure drop per time unit, $LT_{nominal}$ is the nominal lifetime of the gas filling, $p_{low}$ is the minimum pressure value of the gas filling and No is the maximum pressure value of the gas filling.

3. The method as claimed in claim 2, wherein the remaining lifetime $LT_{remain}$ of the gas filling is calculated by use of the formula:

$$LT_{remain} = LT_{total} \cdot \frac{p_2 - p_{low}}{p_{high} - p_{low}}$$

4. The method as claimed in claim 1, wherein the total lifetime $LT_{total}$ of the gas filling is calculated by use of the formula:

$$LT_{total} = \Delta t \cdot \frac{p_{high} - p_{low}}{\Delta p} = (t_2 - t_1) \cdot \frac{p_{high} - p_{low}}{p_2 - p_1}$$

wherein $p_1$ is the first pressure value, $p_2$ is the second pressure value, $p_{low}$ is the minimum pressure value of the gas filling, $p_{high}$ is the maximum pressure value of the gas filling, $\Delta p$ is the pressure difference between the second pressure value $p_2$ and the first pressure value $p_1$, $t_1$ is the first point in time and $t_2$ is the second point in time and $\Delta t$ is the time difference between the second point in time $t_2$ and the first point in time $t_1$.

5. The method as claimed in claim 1, wherein the remaining lifetime $LT_{remain}$ of the gas filling is calculated by use of the formula:

$$LT_{remain} = \Delta t \cdot \frac{p_2 - p_{low}}{\Delta p} = (t_2 - t_1) \cdot \frac{p_2 - p_{low}}{p_2 - p_1}$$

wherein $p_1$ is the first pressure value, $p_2$ is the second pressure value, $p_{low}$ is the minimum pressure value of the gas filling, $\Delta p$ is the pressure difference between the second pressure value $p_2$ and the first pressure value $p_1$, $t_1$ is the first point in time and $t_2$ is the second point in time and $\Delta t$ is the time difference between the second point in time $t_2$ and the first point in time $t_1$.

6. The method as claimed in claim 1, wherein the first pressure value $p_1$ is replaced by $p_{1corr}$ and referenced to a reference temperature $T_{ref}$ and/or the second pressure value $p_2$ is replaced by $p_{2corr}$ and referenced to a reference temperature $T_{ref}$ by use of the formula:

$$p_{1corr} = p_1 - R \cdot \frac{T_1 - T_{ref}}{V_{gas}}$$

$$p_{2corr} = p_2 - R \cdot \frac{T_2 - T_{ref}}{V_{gas}}$$

wherein $T_1$ is the first temperature, $T_2$ is the second temperature, $V_{gas}$ is the volume of the gas filling, R is the gas constant of the gas filling, $p_{1corr}$ is the first corrected pressure value and $p_{2corr}$ is the second corrected pressure value.

7. The method as claimed in claim 1, wherein an alarm is output if the first pressure value $p_1$ or the second pressure value $p_2$ drops below a minimum pressure value $p_{low}$ of the gas filling.

8. A system for predicting a lifetime of a gas filling of an electrical switchgear, the system comprising:

i. a pressure sensor for measuring a pressure value in a system of the electrical switchgear, said pressure sensor including a capacitor having an elastomer as a dielectric material between two electrodes of the capacitor;

ii. a temperature sensor for measuring a temperature value in the system of the electrical switchgear;

iii. an evaluation unit, which comprises a processor and a memory, said capacitive pressure sensor and the temperature sensor being connected to the evaluation unit;

wherein the system is configured to perform the steps of:

a) measuring, using said pressure sensor, a first pressure value $p_1$ in the system of the electrical switchgear containing the gas filling at a predefined temperature $T_p$, measured using said temperature sensor, at a first point in time $t_1$ and measuring a second pressure value $p_2$, using said pressure sensor, in the system of the electrical switchgear containing the gas filling at the same predefined temperature $T_p$, measured using said temperature sensor, at a second point in time $t_2$; or, b) measuring, using said pressure sensor, a first pressure value $p_1$ in the system of the electrical switchgear containing the gas filling at a first temperature $T_1$, measured using said temperature sensor, within a predefined temperature range at a first point in time $t_1$ and measuring a second pressure value $p_2$, measured using said pressure sensor, in the system of the electrical switchgear containing the gas filling at a second temperature $T_2$, measured using said temperature sensor, within the same predefined temperature range at a second point in time $t_2$;

calculating a pressure difference $\Delta p$ between the first pressure value $p_1$ and the second pressure value $p_2$; and, calculating a lifetime of the gas filling based on said pressure difference $\Delta p$, wherein, the first pressure value $p_1$ and/or the second pressure value $p_2$ is calculated based on a volume change of a capacitor having an elastomer as a dielectric material between two electrodes of the capacitor.

* * * * *